United States Patent
Kosmach et al.

(10) Patent No.: US 7,054,386 B1
(45) Date of Patent: May 30, 2006

(54) METHOD AND APPARATUS FOR ASSIGNING BIT METRICS FOR SOFT DECISION DECODING

(75) Inventors: James J. Kosmach, San Diego, CA (US); Frederic Fontaine, New York, NY (US)

(73) Assignee: Motorola, Inc., Schaumburg, IL (US)

( * ) Notice: Subject to any disclaimer, the term of this patent is extended or adjusted under 35 U.S.C. 154(b) by 974 days.

(21) Appl. No.: 09/590,594

(22) Filed: Jun. 9, 2000

(51) Int. Cl.
*H04L 5/12* (2006.01)

(52) U.S. Cl. .................. 375/316; 375/265; 375/341; 714/780

(58) Field of Classification Search ................ 375/316, 375/341, 265, 260, 334, 346; 348/555, 607, 348/608, 614; 714/702, 795, 796, 784, 780
See application file for complete search history.

(56) References Cited

U.S. PATENT DOCUMENTS

| | | | | |
|---|---|---|---|---|
| 5,278,870 A | * | 1/1994 | Mays et al. | 375/346 |
| 5,701,332 A | * | 12/1997 | Decrouez | 375/334 |
| 5,742,620 A | * | 4/1998 | Iwamura | 714/784 |
| 5,991,341 A | * | 11/1999 | Shin | 375/265 |
| 6,108,044 A | * | 8/2000 | Shin | 348/555 |
| 6,351,498 B1 | * | 2/2002 | Yamao et al. | 375/260 |
| 6,496,547 B1 | * | 12/2002 | Powell et al. | 375/316 |

* cited by examiner

*Primary Examiner*—Khai Tran
*Assistant Examiner*—Edith Chang
(74) *Attorney, Agent, or Firm*—Matthew C. Loppnow

(57) ABSTRACT

A receiver includes a detector and a decoder. The detector is adapted to demodulate a received signal to generate a received word. The received word includes a plurality of symbols, and each symbol contains data associated with a first phase and data associated with a second phase. The detector is further adapted to generate a plurality of energy values relating each received symbol to one of a plurality of potential symbols. The decoder is adapted to generate a first set of bit metrics based on the energy values in response to the receiver being assigned to the first phase and a second set of bit metrics based on the energy values in response to the receiver being assigned to the second phase. The decoder is further adapted to identify the least reliable bits in the received word based on one of the first and second sets of bit metrics.

25 Claims, 2 Drawing Sheets

METHOD AND APPARATUS FOR ASSIGNING BIT METRICS FOR SOFT DECISION DECODING

FIELD OF THE INVENTION

This invention relates generally to data transmission, and, more particularly, to a method and apparatus for assigning bit metrics for algebraic soft decision decoding.

BACKGROUND OF THE INVENTION

One of the primary goals in the design of a paging system is the maximization of battery life. Because there are few real-time processing constraints, synchronous time slots may be used for sending messages. A given pager looks for its address in a predetermined number of frames within a frame cycle, and stays idle the rest of the time. This time slot approach represents a trade off between delivery latency and energy conservation. One such paging protocol is the FLEX® protocol, proffered my Motorola, Inc.

The FLEX® protocol employs a pulse amplitude modulation/frequency modulation (PAM/FM) scheme for generating transmit symbols. Four possible bit patterns, {00, 01, 10, 11}, are pulse amplitude modulated to generate a waveform having a corresponding magnitude mapping of {00→−3,01→−1,11→+1,10→+3}. The spectrum of the 4-level PAM signal is shaped by a 10th order Bessel filter, and the resulting baseband signal is passed through a D/A converter before being FM modulated with the following deviation between symbols: {00→−4800 Hz,01→−1600 Hz,11→+1600 Hz,10→+4800 Hz}.

Pagers implementing the FLEX protocol are assigned a particular phase depending on the time slots within the frame cycle in which they are to look for messages addressed to them. The most significant bits of the 4-ary symbols belong to phase A, while the least significant bits belong to phase B, and so on with phases C and D. Because of the small length of the messages to be delivered, the mobile messaging system uses short block error control codes that generate a set of parity bits from a fixed set of information bits. The FLEX protocol uses a (31,21) Bose-Chaudhuri-Hocquenghem (BCH) code (i.e., 21 information bits and 10 parity bits), extended to a (32,21) code with the addition of an even parity bit. The resulting (32, 21) code can correct all double-error patterns and detect all triple-error patterns.

In the pager unit there is a trade off that must be considered between accuracy and processing load. Generally, the higher degree of accuracy desired, the higher the processing load on the receiver (processor) in the pager. Various decoding techniques are available for determining the received symbols. These techniques include soft decision decoders where probability values for the received bits are determined and refined, and hard decision techniques that make a 0/1 determination for the received bits.

Generally, in the decoding process of a digital system, the use of soft information, delivered by a demodulator, has been shown to achieve significant gain over a strictly hard decision technique. Knowledge of channel measurement information allows a soft decision decoder to estimate the reliability of the observation symbols and treat them accordingly. A hard decision decoder, on the other hand, operates on the received values regardless of their degree of reliability by mapping them onto the code alphabet. The hard decision technique cannot distinguish small errors from large ones.

Implementation of an optimum soft decision technique is computationally intensive and generally not feasible in an operating environment such as a paging system. There are a number of sub-optimum techniques that may be used to provide some of the increased accuracy of soft decision making without all of the computational load. One such class of sub-optimum decoders uses algebraic hard decision decoders (HDD) in conjunction with soft decision decoding algorithms. The resulting soft decision decoders (SDDs) are more complex than the original HDDs, but the performance improvement is substantial. Two known algebraic SDD algorithms are the Chase algorithm and the Generalized Minimum Distance (GMD) algorithm.

The basic idea underlying the algebraic SDD techniques is the use of "soft" symbol reliability information to postulate the location of likely errors in the received words. Through the use of appropriate metrics, the decoder tracks the symbols with the lowest reliability, and focuses the decoding capability on those symbols. The performance of the soft decision algorithm thus depends on the ability of the application to successfully locate the least reliable bits in a received word.

Due to interleaving and demodulation methods used in the FLEX protocol, there may be a performance difference between phase A (message in most significant bits) and phase B (message in least significant bits) pagers. This performance difference is similar for phases C and D.

The present invention is directed to overcoming, or at least reducing the effects of, one or more of the problems set forth above.

BRIEF DESCRIPTION OF THE DRAWINGS

The invention may be understood by reference to the following description taken in conjunction with the accompanying drawing, in which like reference numerals identify like elements, and in which.

Figure 1:
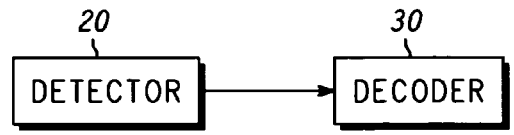
FIG. 1 is a simplified block diagram of a receiver in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE PREFERRED EMBODIMENT

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. For example, the preferred embodiment for much of the functionally described herein would require various software programs. These programs are not described as they would be wherewithal of one of ordinary skill given the teachings herein and such descriptions would only serve to obscure the inventive principles hereof.

Referring now to the Figures, and, in particular, to FIG. 1, a block diagram of a receiver 10 in accordance with one embodiment of the present invention is provided. The receiver 10 is adapted to receive and decode messages transmitted using the PAM/FM technique described above. The receiver 10 includes a detector 20 adapted to detect the transmitted symbols and a decoder 30 adapted to perform error correction and decoding functions. Although the present invention is described within the context of the FLEX protocol, the invention is not so limited, and the concepts may be applied to various communications or messaging protocols.

Figure 2:
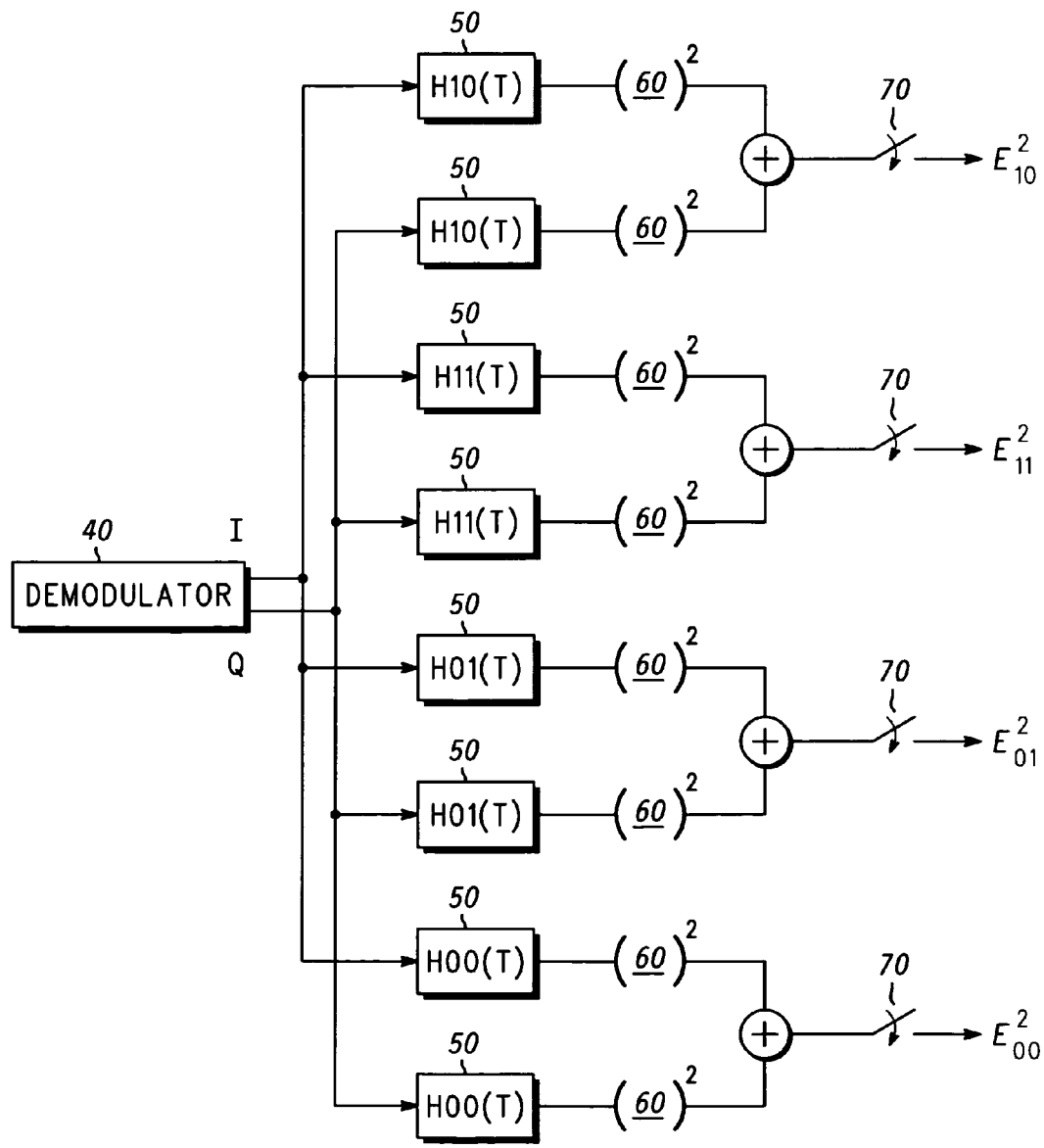
FIG. 2 is a simplified block diagram of a first embodiment of a detector in the receiver of FIG. 1.

In a first embodiment of the present invention, the detector 20 is an envelope detector as shown in greater detail in FIG. 2. Envelope detection is typically optimum for orthogonal frequency shift keying (FSK) signals, and although the signaling used in accordance with the FLEX protocol is not exactly orthogonal FSK, the performance is similar due to the baseband pulse shaping of the PAM signal. The construct and operation of an envelope detector are well known to those of ordinary skill in the art. Hence, for clarity and to prevent unnecessarily obscuring the instant invention, only a high-level discussion is provided.

As shown in FIG. 2, the detector 20 includes a demodulator 40 adapted to generate inphase (I) and quadrature (Q) signal components that are provided to a bank of filters 50. In the illustrated embodiment, the filters are matched to the FSK signal without Bessel filtering to provide an efficiency gain without significant performance degradation. The magnitudes of the inphase and quadrature filters 50 are squared 60 and added to generate energy values, $\epsilon^2_{jk}$, for each of the possible symbols, jk=00, 01, 10, 11. The output signal of the detector 20 is sampled 70 at a rate of 3200 samples per second.

The decoder 30 receives the output energy measurement from the detector 20 and generates bit metrics for use in determining the least reliable bits. Generally, the larger the detected value $\epsilon^2_{jk}$, the more likely the supposition that the associated symbol was transmitted. The decoder 30 converts the symbol soft-value to a bit metric for each phase. Let M be an upper bound on the value of $\epsilon_{jk}$.

The bit metrics for phase A are as follows:

$$r1 = \min|M - \varepsilon_{1k}| \text{ for } k = 0, 1 \quad (1)$$

$$r0 = \min|M - \varepsilon_{0k}| \text{ for } k = 0, 1. \quad (2)$$

The bit metrics for phase B are as follows:

$$r1 = \min|M - \varepsilon_{j1}| \text{ for } j = 0, 1 \quad (3)$$

$$r0 = \min|M - \varepsilon_{j0}| \text{ for } j = 0, 1. \quad (4)$$

For a given received word, the decoder 30 generates the 2 binary sequences corresponding to the hard decision for each phase by selecting the symbols with the largest energy measurement $\epsilon_{jk}$. The decoder 30 then computes the bit metrics for each bit based on the above formulas. The p bits of each word having the largest metric values represent the p least reliable bits.

Figure 3:
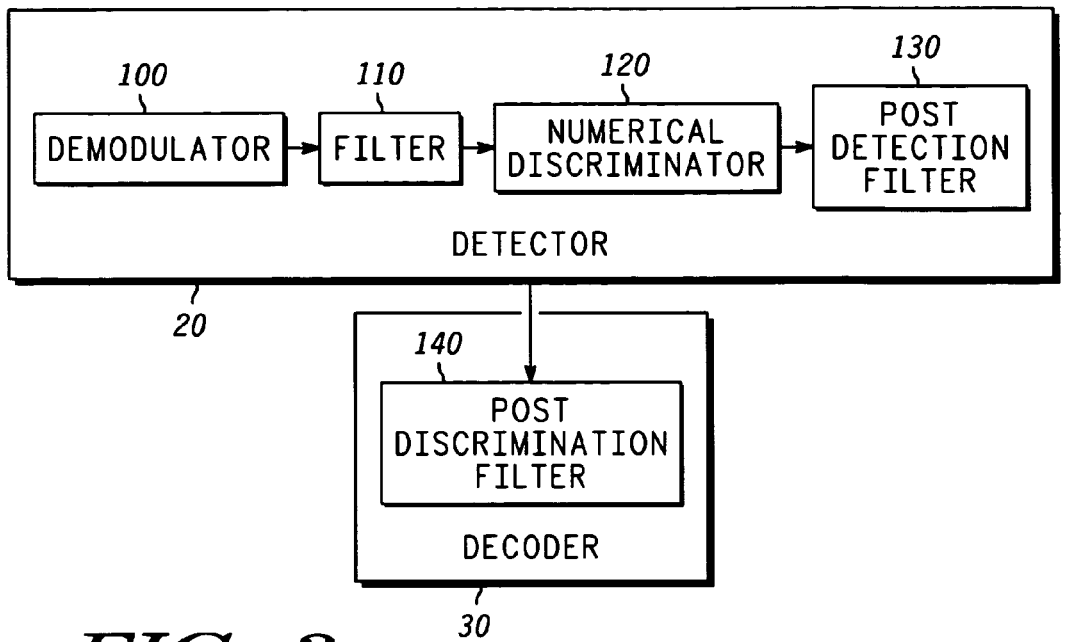
FIG. 3 is a simplified block diagram of a second embodiment of a detector in the receiver of FIG. 1.

In a second embodiment of the present invention, the detector 20 is a discriminator detector as shown in greater detail in FIG. 3. Discrimination detection may be implemented using commercially available analog FM demodulators. The construct and operation of a discriminator detector are well known to those of ordinary skill in the art. Hence, for clarity and to prevent unnecessarily obscuring the instant invention, only a high-level discussion is provided.

The detector 20 includes a demodulator 100, a filter 110, a numerical discriminator 120, and a post detection filter 130. In the illustrated embodiment, the filter 110 includes a first stage $2^{nd}$ order Butterworth filter with a 3 dB bandwidth of 11 kHz and a second stage $6^{th}$ order Butterworth filter with a 3 dB bandwidth of 16 kHz. The numerical discriminator 120 produces a baseband signal that is similar to the filtered PAM signal generated at the transmitter (not shown), however, the baseband signal is passed through the post detection filter 130 to remove additional noise. In the illustrated embodiment, the post detection filter is a $3^{rd}$ order Bessel filter. The resulting baseband signal is then sampled at 3200 symbols per second to provide an output energy, $\hat{\chi}$.

The decoder 30 compares the output energy, $\hat{\chi}$, to each of the potential transmitted symbol energies $\{-3, -1, 1, 3\}$ to generate the soft values defined by:

$$\varepsilon_{jk} = |\hat{\chi} - \chi_{jk}|. \quad (5)$$

It is well known to those of ordinary skill in the art that, as the Signal to Noise Ratio (SNR) degrades, the output of the discriminator detector 20 exhibits "clicks." One method for overcoming this non-linear phenomenon is to clip the bit metrics to a certain threshold. Clipping the bit metrics avoids complications that arise from the non-gaussian distribution of the received values around the possible symbols. The equation for the clipped soft values is:

$$\varepsilon_{jk} = \begin{cases} |\hat{\chi} - \chi_{jk}| : |\hat{\chi} - \chi_{jk}| \leq 2 \\ 2 : |\hat{\chi} - \chi_{jk}| \geq 2 \end{cases} \quad (6)$$

To efficiently combat fading, the decoder 30 may use receiver side-information to weight the clipped metric. As the signal fades, the symbol amplitude is reduced, increasing the likelihood of errors. An amplitude measure can thus guide the weighting of the soft values, assigning low reliability weights to the symbols experiencing deep fades. The output, s(t) of the numerical discriminator 120 is based on the in-phase signal x(t) and the quadrature signal y(t) outputs of the demodulator 100 as follows:

$$s(t) = \frac{x(t)y'(t) - y(t)x'(t)}{|x(t)|^2 + |y(t)|^2}. \quad (7)$$

If we use the denominator of Equation 7 as receiver side information, then an estimate of the attenuation of the channel is obtained using the equation:

$$a(t) = |x(t)|^2 + |y(t)|^2. \quad (8)$$

The attenuation factor, a(t), passes through a post discrimination filter 140 in the decoder 30 and is sampled once per symbol period to provide a channel attenuation estimate, a, for each received symbol.

The bit metrics for phase A are as follows:

$$r1 = a^* \min(\varepsilon_{1k}) \text{ for } k = 0, 1 \quad (9)$$

$$r0 = a^* \min(\varepsilon_{0k}) \text{ for } k = 0, 1. \quad (10)$$

The bit metrics for phase B are as follows:

$$r1 = a^* \min(\varepsilon_{j1}) \text{ for } j = 0, 1 \quad (11)$$

$$r0 = a^* \min(\varepsilon_{j0}) \text{ for } j = 0, 1. \quad (12)$$

The p bits of each word having the largest metric values represent the p least reliable bits.

After determining the p least reliable bits, the decoder 30, regardless of whether the envelope detection or discriminator detection was employed, employs an algebraic decoding algorithm to determine the construct of the received word. The number of least reliable bits selected depends on the degree of accuracy desired and the available processing resources. Obviously, as the number of least reliable bits selected increases, so do the processing requirements.

For illustrative purposes, the construct of a Chase algebraic decoding algorithm is described, however, the invention is not limited to such a technique. Other decoding techniques, such as a Generalized Minimum Distance (GMD) algorithm, may also be used.

Figure 4:
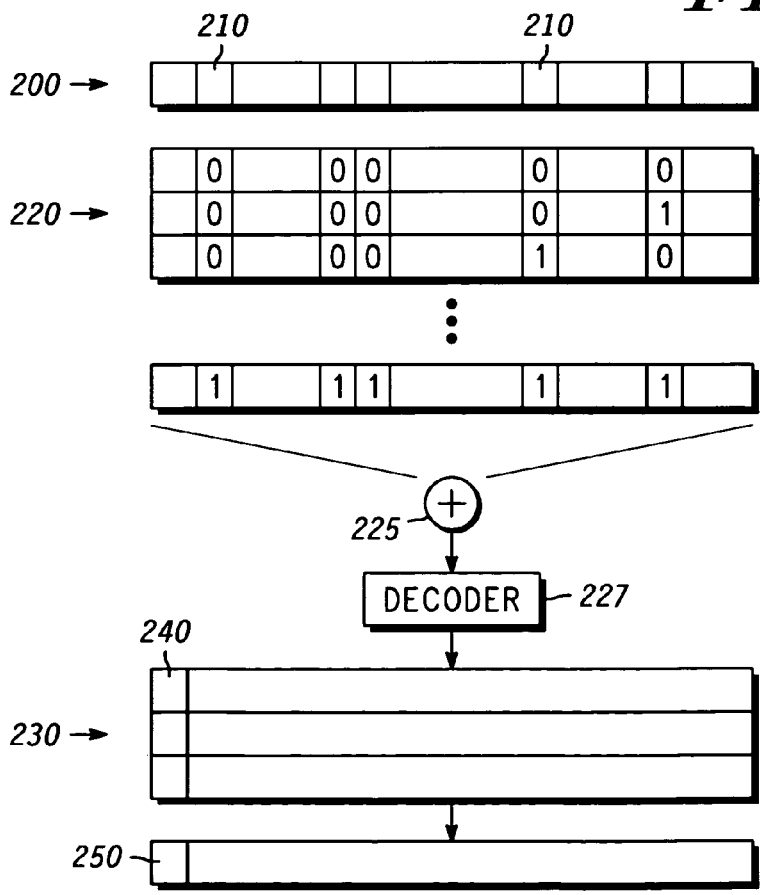
FIG. 4 is a simplified functional block diagram of a decoding algorithm implemented by the receiver of FIG. 1.

Referring now to FIG. 4, a functional diagram illustrating a Chase soft decision decoding algorithm is provided. The p least reliable bits identified as described above are the bits for which the hard decision is the most likely to be incorrect. Therefore, instead of directly decoding the hard decision of the received word, the decoder 30 attempts to decode all binary words formed by allowing the p unreliable locations of the hard decision to take on all $2^p$ possible values. In other words, the Chase algorithm can be seen as the decoding of a hard decision word to which has been applied a set of error patterns corresponding to the locations of the most unreliable bits. As shown in FIG. 4, the decoding steps are as follows. A word 200 is received, and the p least reliable bits 210 are designated as described above. The $2^p$ error patterns 220 are determined and added (modulo 2) in an adder 225 to the hard decision of the received word 200 to generate modified words, which are decoded in a decoder 227 to generate candidate codewords 230, and the candidate codewords 230 receive a check bit 240. The candidate codeword 230 that is closest to the received word is selected as a most probable received codeword 250.

To determine which of the candidate codewords 230 is the most likely, the decoder 30 calculates a word metric consisting of the sum of the reliability of the bit metrics for each candidate codeword 230. Based on the individual bit metrics for each bit, including the parity check bit, the measure of the likelihood of a candidate codeword 230 is the sum of the metrics of the 32 bits. The candidate codeword 230 having the smallest word metric is selected as the most probable received codeword 250.

Selecting the least reliable bits based on the assigned phase of the pager, as described above, allows the decoder 30 to focus its resources on the least reliable bits that are of the most importance for the particular pager, rather than just the least reliable bits for the entire word. Combining the phase-particular bit metric determination with the gain provided by the algebraic decoding algorithm (e.g., Chase) allows for a significant performance gain over a strictly hard decision detection algorithm without all of the complexity required to implement a full soft decision detection algorithm (e.g., trellis).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A receiver, comprising:
   a detector adapted to demodulate a received signal to generate a received word, the received word including a plurality of received symbols, each of the received symbols containing data associated with a first phase and data associated with a second phase, the detector being further adapted to generate a plurality of energy values relating each of the received symbols to one of a plurality of potential symbols; and
   a decoder adapted to generate a first set of bit metrics based on the energy values in response to the receiver being assigned to the first phase and a second set of bit metrics based on the energy values in response to the receiver being assigned to the second phase, the decoder being further adapted to identify the least reliable bits in the received word based on one of the first and second sets of bit metrics.

2. The receiver of claim 1, wherein the decoder is further adapted to generate a plurality of candidate codewords based on the received word and the least reliable bits.

3. The receiver of claim 2, wherein the decoder is adapted to generate a word metric comprising the sum of the bit metrics in one of the first and second sets for each of the plurality of candidate codewords.

4. The receiver of claim 3, wherein the decoder is adapted to identify the candidate codeword having a greatest bit metric as a received codeword.

5. The receiver of claim 1, wherein the detector comprises an envelope detector including a plurality of filters, each filter being adapted to generate a soft symbol energy associated with one of the potential symbols.

6. The receiver of claim 5, wherein a first subset of the potential symbols correspond to a binary 1 for the first phase and a second subset of the potential symbols correspond to a binary zero for the first phase, and the decoder is adapted to select the soft symbol energy in each of the first and second subsets closest to an upper bound energy threshold to generate the first set of bit metrics.

7. The receiver of claim 6, wherein a third subset of the potential symbols correspond to a binary 1 for the second phase and a fourth subset of the potential symbols correspond to a binary zero for the second phase, and the decoder is adapted to select the soft symbol energy in each of the second and third subsets closest to an upper bound energy threshold to generate the second set of bit metrics.

8. The receiver of claim 1, wherein the detector comprises a discriminator detector adapted to generate an output energy, and the decoder is adapted to compare the output energy to a plurality of potential symbol energy thresholds to generate soft energies associated with the potential symbols.

9. The receiver of claim 8, wherein the decoder is adapted to clip the energy values at a maximum value.

10. The receiver of claim 8, wherein the decoder is adapted to generate a channel attenuation estimate for each of the received symbols and generate one of the first and second sets of bit metrics based on the channel attenuation estimate.

11. The receiver of claim 8, wherein a first subset of the potential symbols correspond to a binary 1 for the first phase and a second subset of the potential symbols correspond to a binary zero for the first phase, and the decoder is adapted to select a soft symbol energy in each of the first and second subsets closest to the associated potential symbol energy threshold to generate the first set of bit metrics.

12. The receiver of claim 9, wherein a third subset of the potential symbols correspond to a binary 1 for the second phase and a fourth subset of the potential symbols correspond to a binary zero for the second phase, and the decoder is adapted to select a soft symbol energy in each of the second and third subsets closest to the associated potential symbol energy threshold to generate the second set of bit metrics.

13. A method for assigning bit metrics for algebraic decoding in a receiver, comprising:
    demodulating a received signal to generate a received word, the received word including a plurality of received symbols, each of the received symbols containing data associated with a first phase and data associated with a second phase;
    generating a plurality of energy values relating each of the received symbols to one of a plurality of potential symbols;
    generating a first set of bit metrics based on the energy values in response to the receiver being assigned to the first phase and a second set of bit metrics based on the energy values in response to the receiver being assigned to the second phase; and
    designating the least reliable bits in the received word based on one of the first and second sets of bit metrics.

14. The method of claim 13, further comprising generating a plurality of candidate codewords based on the received word and the least reliable bits.

15. The method of claim 14, further comprising generating a word metric comprising the sum of the bit metrics in one of the first and second sets for each of the plurality of candidate codewords.

16. The method of claim 15, further comprising designating the candidate codeword having a greatest bit metric as a received codeword.

17. The method of claim 13, further comprising generating a soft symbol energy associated with each of the potential symbols.

18. The method of claim 17, wherein a first subset of the potential symbols correspond to a binary 1 for the first phase and a second subset of the potential symbols correspond to a binary zero for the first phase, and the method further comprises selecting the soft symbol energy in each of the first and second subsets closest to an upper bound energy threshold to generate the first set of bit metrics.

19. The method of claim 18, wherein a third subset of the potential symbols correspond to a binary 1 for the second phase and a fourth subset of the potential symbols correspond to a binary zero for the second phase, and the method further comprises selecting the soft symbol energy in each of the second and third subsets closest to an upper bound energy threshold to generate the second set of bit metrics.

20. The method of claim 13, further comprising:
    generating an output energy associated with each of the received symbols; and
    comparing the output energy to a plurality of potential symbol energy thresholds to generate soft energies associated with the potential symbols.

21. The method of claim 20, further comprising clipping the soft energy values at a maximum value.

22. The method of claim 20, further comprising:
    generating a channel attenuation estimate for each received symbol; and
    generating one of the first and second sets of bit metrics based on the channel attenuation estimate.

23. The method of claim 20, wherein a first subset of the potential symbols correspond to a binary 1 for the first phase and a second subset of the potential symbols correspond to a binary zero for the first phase, and the method further comprises selecting a soft symbol energy in each of the first and second subsets closest to the associated potential symbol energy threshold to generate the first set of bit metrics.

24. The method of claim 21, wherein a third subset of the potential symbols correspond to a binary 1 for the second phase and a fourth subset of the potential symbols correspond to a binary zero for the second phase, and the method further comprises selecting a soft symbol energy in each of the second and third subsets closest to the associated potential symbol energy threshold to generate the second set of bit metrics.

25. A receiver, comprising:
    means for demodulating a received signal to generate a received word, the received word including a plurality of received symbols, each of the received symbols containing data associated with a first phase and data associated with a second phase;
    means for generating a plurality of energy values relating each of the received symbols to one of a plurality of potential symbols;
    means for generating a first set of bit metrics based on the energy values in response to the receiver being assigned to the first phase and a second set of bit metrics based on the energy values in response to the receiver being assigned to the second phase; and
    means for designating the least reliable bits in the received word based on one of the first and second sets of bit metrics.

* * * * *